& Clarke

United States Patent [19]

Pitt et al.

[11] Patent Number: 4,668,085
[45] Date of Patent: May 26, 1987

[54] PHOTO-ELASTIC SENSOR

[75] Inventors: Gilles D. Pitt, Essex; Philip Extance, Cambridge; Rosamund C. Neat, London; Roger E. Jones, Cambridge, all of England

[73] Assignee: Standard Telephones & Cables plc, London, England

[21] Appl. No.: 726,972

[22] Filed: Apr. 25, 1985

[30] Foreign Application Priority Data

Apr. 28, 1984 [GB] United Kingdom ............... 8410929

[51] Int. Cl.[4] .................... G01B 11/16; G02B 5/30; G02F 1/01
[52] U.S. Cl. ...................................... 356/32; 356/33; 350/371; 324/96; 250/225
[58] Field of Search .................... 356/32, 33; 318/118; 250/225, 231 R; 324/96; 350/371

[56] References Cited

U.S. PATENT DOCUMENTS

| | | | |
|---|---|---|---|
| 1,921,852 | 8/1933 | Whitaker | 350/371 X |
| 3,324,295 | 6/1967 | Harris | 350/371 X |
| 3,432,647 | 3/1969 | Wilmotte | 350/371 X |
| 3,867,014 | 2/1975 | Kemp | 350/371 |
| 4,239,329 | 12/1980 | Matsumoto | 350/96.15 |
| 4,376,248 | 3/1983 | Giallorenzi et al. | 250/227 |
| 4,378,497 | 3/1983 | Giallorenzi | 324/96 X |
| 4,442,350 | 4/1984 | Rashleigh | 324/96 X |
| 4,516,021 | 5/1985 | Taylor | 324/96 X |

FOREIGN PATENT DOCUMENTS

| | | | |
|---|---|---|---|
| 2739598 | 3/1979 | Fed. Rep. of Germany | 324/96 |
| 0054466 | 5/1977 | Japan | 324/96 |

*Primary Examiner*—Eugene R. LaRoche
*Assistant Examiner*—David Mis
*Attorney, Agent, or Firm*—Kerkam, Stowell, Kondracki & Clarke

[57] ABSTRACT

Certain materials (e.g. polymers, glasses) exhibit the photo-elastic effect, whereby when they are subject to stress become birefringent, which influences a light beam passing through the glass. This beam, e.g. from a laser is collimated and circularly polarized as it approaches the glass and is again polarized as it leaves the glass. This stress is applied, according to this invention, by magnetostrictive strips on the glass which are influenced, by the magnetic field to be measured or the AC bias field. A miniaturized arrangement using this principle is described.

4 Claims, 5 Drawing Figures

PHOTO-ELASTIC SENSOR

This invention relates to sensors in which the photo-elastic effect is exploited.

BACKGROUND OF THE INVENTION

Photo-elasticity is the phenomenon of stress (or strain) induced birefringence in optically transparent materials. Many such materials are isotropic when unstressed, but when subjected to an uniaxial stress a difference in the index of refraction between the stress direction and directions orthogonal thereto is introduced. Hence the materials exhibit a birefringence which depends on the amount of the uniaxial stress applied to the photo-elastic material. This means that the photo-elastic effect can be used to detect stress. To do this, in one known arrangement, circularly polarised collimated light from an optical source is passed through a piece of photo-elastic material which is subjected to stress along the Z axis. The light passing through an analyzer is then detected. The intensity variations of this light are a measure of the stress.

Arrangements of the above type are described in a paper entitled "Multimode Fiber Optic Sensors" by W. B. Spillman, Jnr., and D. H. McMahon, of the Sperry Research Centre, USA, at pages 160-163 of Proc. Optical Fibre Sensors Conference, Apr. 26-28 1983, IEE, Savoy Place, London. One example of a photo-elastic material is a glass obtainable from the Edmond Scientific Co. Another suitable photo-elastic material is a Pyrex glass.

SUMMARY OF THE INVENTION

An object of the invention is to extend the usefulness of sensors in which photo-elastic materials are used.

According to the invention there is provided a sensor which includes a member of a photo-elastic material which may be subjected to stress to sense a parameter to be monitored, one or more portions of magnetostrictive material in operative relation with the photo-elastic material, means whereby the magnetostrictive effect of the magenetostrictive material is influenced by the parameter to be monitored, so that the magnetostrictive effect causes birefringence in the photo-elastic material to an extent appropriate to the parameter being monitored, means for directing a light beam through the member of photo-elastic material, and means for detecting the light beam after its passage through the photo-elastic material, the arrangement being such that the light received by the detector depends on the extent of the birefringence and thus on the parameter to be monitored.

BRIEF DESCRIPTION OF THE DRAWING

Embodiments of the invention will now be described with reference to the accompanying drawing, in which.

DESCRIPTION OF THE PREFERRED EMBODIMENTS

Figure 1:
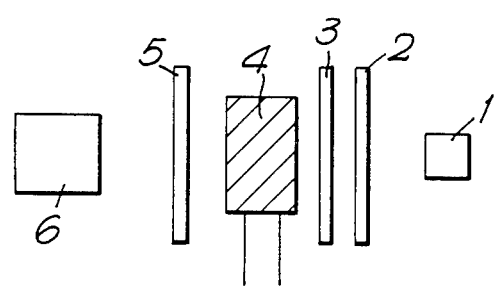
FIG. 1 shows schematically the arrangement of a sensor using a photo-elastic material.

In the arrangement shown in FIG. 1, a light source 1, which could be a laser or a light-emitting diode, or the end of an optical fibre conveying light is aimed at a first linear polariser 2. After the light has been circularly polarised by a further polariser 3 it passes through a block or prism 4 of photo-elastic material, e.g. a Pyrex glass, from which the light reaches another linear polariser 5. This second polariser is crossed with respect to the orientation of the first polariser 2. After the second polariser the light passes to a detector 6. Linear and circular polarisers as used herein are well-known to those skilled in the art.

Figure 2:
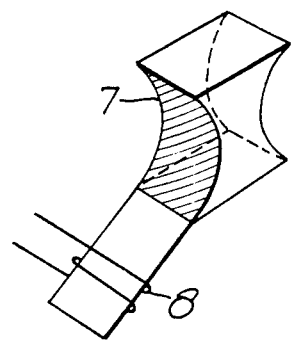
FIG. 2 shows schematically one form which the photo-elastic material can take when used with magnetostrictive material.

A possible structure for the photo-elastic member 4 is shown in more detail in FIG. 2; here it is seen that its sides which are parallel to the direction of travel of the light are each provided with a strip, such as 7, of a magnetostrictive material. One suitable material for this purpose is a metallic glass, and a typical composition for this material is 80% iron and 20% boron. Another suitable material for the magnetostrictive strips is nickel.

If the arrangement is located in a magnetic field, the field, via the magnetostrictive layer applies stress to the photo-elastic material, which induces birefringence. Hence the amount of light which reaches the detector 6 (FIG. 1) is modified in a manner appropriate to the magnitude of the stress. An alternative way of using the sensor to measure magnetic field is to apply an alternating current, or frequency fo to a coil 8 wound on an extension portion 9 of the magnetostrictive strip 7. This excites a fundamental frequency component in the signal at the photodetector which is a measure of the ambient DC magnetic field in the sensor region. Note here that since the magnetostriction is an even function of the field, a DC field generates a fundamental frequency component. Alternating magnetic fields of frequencies fo can also be detected as sidebands on fo.

Figure 3:
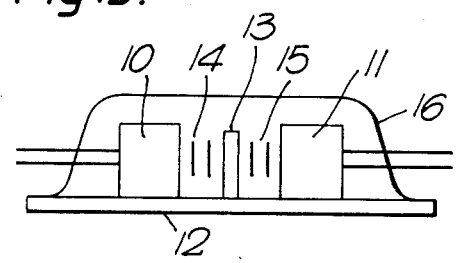
FIGS. 3 and 4 are two views of a miniaturized thick film sensor embodying the invention.
Figure 4:
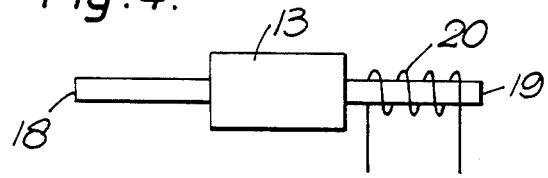

FIGS. 3 and 4 show schematically a miniaturised sensor which embodies the principles of the present invention. These figures are highly schematic. In this arrangement, the source 10 and the detector 11 are mounted on an insulating substrate 12, with the photo-elastic member 13 between them. The polarisers and the quarter-wave plates are schematically indicated at 14 and 15, and the whole is enclosed in a plastics coating 16 or a standard thick film hybrid hermetic package.

As can be seen from FIG. 4, the photo-elastic member 13 is, in this case, a rectangular block, with rods or strips 18, 19 of magnetostrictive material one on each side thereof. Note that FIG. 4 represents the member 13 at 90° to the plane of FIG. 3. A coil 20 on one of the rods, 19 in this case, applies a current dependent on the parameter to be monitored, to the member 13, so that the device can be used as a current sensor. Alternatively the current can be used to bias the sensor as described earlier to allow AC detection of DC magnetic fields, eliminating low frequency drift problems. Note that another coil can be mounted on the rod 18, with the coils suitably oriented for their effects to be additive.

Such a device can be made responsive to very small fields in the presence of the relatively large earth's magnetic field.

Figure 5:
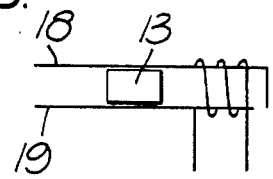
FIG. 5 is a view similar to FIG. 4 of another miniaturized sensor embodying the invention.

FIG. 5 shows an arrangement similar to that of FIG. 4, in which the strips 18, 19, of magnetostrictive material are one on each side of the photo-elastic material.

We claim:

1. A sensor for responding to a magnetic field, which includes a block of glass or glass-like optically transparent material which exhibits the photo-elastic effect, a light source from which light is projected through the said block via first polarising means which render the light circularly polarised before it enters the block, second polarising means via which light leaving the block reaches detector means, said block having two side faces which are generally parallel to the direction of travel of the light beam in the block, said side faces being curved inwards, and magnetostrictive means which includes two strips of magnetostrictive material one on each of said curved faces, wherein said magnetostrictive means responds to a magnetic field to be responded to to subject the block to stress the value of which depends on the strength of that field, and wherein said stress influences the birefringence of the block so as to vary the parameters of the light reaching the detection means in a manner appropriate to the value of the magnetic field.

2. A sensor as claimed in claim 1, in which at least one of said strips of magnetostrictive material has an extension embraced by a coil carrying an electrical current whose value is proportional to the value of a parameter to be sensed and which applies a bias field so as to produce in the magnetostrictive material a magnetic field whose value depends on that of a parameter to be sensed.

3. A sensor as claimed in claim 1, in which the magneto-strictive material is a metallic glass.

4. A sensor as claimed in claim 1, and which includes means to mount the sensor on an insulating substrate and a plastics coating enclosing the sensor.

* * * * *